: US 6,548,353 B2
: Apr. 15, 2003

(12) United States Patent
Tseng

(54) METHOD OF MAKING NONVOLATILE MEMORY DEVICE HAVING REDUCED CAPACITANCE BETWEEN FLOATING GATE AND SUBSTRATE

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/935,604

(22) Filed: Aug. 24, 2001

(65) Prior Publication Data

US 2003/0045057 A1 Mar. 6, 2003

(51) Int. Cl.⁷ .............................................. H01L 21/336

(52) U.S. Cl. ...................... 438/257; 438/259; 438/265; 438/594

(58) Field of Search ................................. 438/257, 201, 438/211, 259, 264, 265, 296, 594; 257/314–316, 506, 510

(56) References Cited

U.S. PATENT DOCUMENTS 6,323,085 B1 * 11/2001 Sandhu et al. .............. 438/257

\* cited by examiner

*Primary Examiner*—Olik Chaudhuri
*Assistant Examiner*—Hsien Ming Lee
(74) *Attorney, Agent, or Firm*—Intellectual Property Solutions, Incorporated

(57) ABSTRACT

This invention discloses a method of making a nonvolatile memory device, wherein the capacitance between the floating gate and the substrate is reduced to result in a high capacitive coupling ratio. First, a substrate with shallow trench isolation (STI) structures protruding above the substrate and a conductive layer confined between the STI structures is provided. The conductive layer is recessed below the STI structures to leave a recess. A spacer is formed on the sidewalls of the recess to serve as an oxidation mask for the underlying conductive layer. A thermal oxide layer is grown on the conductive layer where it is not covered by the spacer, and the spacer is then removed. An opening is etched through the conductive layer using the thumal oxide layer as an etch mask to define a floating gate. After removing the oxide layer, a thin inter-gate dielectric layer and a control gate layer are sequentially formed.

20 Claims, 4 Drawing Sheets

METHOD OF MAKING NONVOLATILE MEMORY DEVICE HAVING REDUCED CAPACITANCE BETWEEN FLOATING GATE AND SUBSTRATE

BACKGROUND OF THE INVENTION

1. Field of the Invention

The present invention generally relates to a method of making nonvolatile semiconductor memory devices such as an EPROM (erasable programmable read only memory), EEPROM (electrically erasable programmable read only memory) or a flash memory. More particularly, it relates to a method of fabricating a nonvolatile memory device having a reduced capacitance between floating gate and substrate.

2. Description of the Related Arts

High-density nonvolatile memory devices have been receiving much attention in many fields. One of the most important factors is the low cost of the reduced size of each memory cell. However, it is very difficult to shrink the cell size in the fabrication of nonvolatile memory cells when conventional local oxidation (LOCOS) isolation technique is used. The isolation structure formed by this technique has very large dimensions and thus limits the miniaturization of memory cells.

Another isolation technique called shallow trench isolation (STI) has been introduced to the fabrication of nonvolatile memory devices to reduce the cell size. The conventional field oxides are replaced by STI structures so that the device integration can be effectively improved. However, as component dimensions continue to shrink, the surface area of floating gates also shrinks. This leads directly to a decrease in capacitance of the effective capacitor formed between the floating gate layer and the control gate layer. This decrease in effective capacitance results in a reduction of the capacitive coupling ratio, a parameter that describes the coupling to floating gate of the voltage applied to control gate. The poorly-coupled voltage to floating gate limits the programming and accessing speed characteristics of the memory device.

The capacitive coupling ratio Cp is defined by:

$$Cp = \frac{Ccf}{Ccf + Cfs}$$

where Ccf is capacitance between the control gate and the floating gate; and Cfs is capacitance between the floating gate and the semiconductor substrate.

In order to gain programming and accessing speeds in nonvolatile memories, many attempts have been made to increase the coupling ratio. It can be understood from the above equation that when the capacitance Ccf between the control gate and the floating gate increases, the coupling ratio Cp increases. Therefore, the coupling ratio Cp is generally increased by increasing the capacitor area between the floating gate and control gate, which increases the capacitance Ccf, and therefore the coupling ratio Cp. For example, U.S. Pat. No. 6,171,909 discloses a method for forming a stacked gate of a flash memory cell. The coupling ratio of the stacked gate is increased by forming a conductive spacer. The conductive spacer, which is a portion of the floating gate, increases the capacitor area between the floating gate and control gate. As further background for the manufacture of a nonvolatile memory device, attention is directed to U.S. Pat. Nos. 6,172,396 and 6,180,459.

In the present invention, a high coupling ratio is accomplished by reducing the capacitance Cfs between the floating gate and the semiconductor substrate. The effect is the same as increasing the capacitance Ccf between the control gate and the floating gate.

SUMMARY OF THE INVENTION

An object of the invention is to provide a method of making a nonvolatile memory device having a reduced capacitance between the floating gate and the substrate. The reduction of capacitance between the floating gate and the substrate results in a high capacitive coupling ratio of the memory device.

Another object of the invention is to provide a method for making a nonvolatile device having a reduced size floating gate with a gate width beyond lithography limits.

The above objects are accomplished by providing a method of making a nonvolatile memory device comprising the steps of: providing a substrate with shallow trench isolation (STI) structures protruding above the substrate and a conductive layer confined between the STI structures; recessing the conductive layer below a top surface of the STI structures to leave a recess; forming a spacer on the sidewalls of the recess, the spacer covering a portion of the conductive layer to serve as an oxidation mask; growing an thermal oxide layer on the conductive layer where it is not covered by the spacer; removing the spacer to expose the conductive layer; etching an opening through the conductive layer using the oxide layer as an etch mask to define a floating gate; removing the oxide layer; forming an inter-gate dielectric layer conformally lining the opening and the floating gate; and forming a control gate layer over the inter-gate dielectric layer and filling the opening.

BRIEF DESCRIPTION OF THE DRAWINGS

The above and other objects, features, and advantages of the present invention will become apparent from the following detailed description of preferred embodiments of the invention explained with reference to the accompanying drawings, in which.

DESCRIPTION OF THE PREFERRED EMBODIMENTS

Figure 3A:
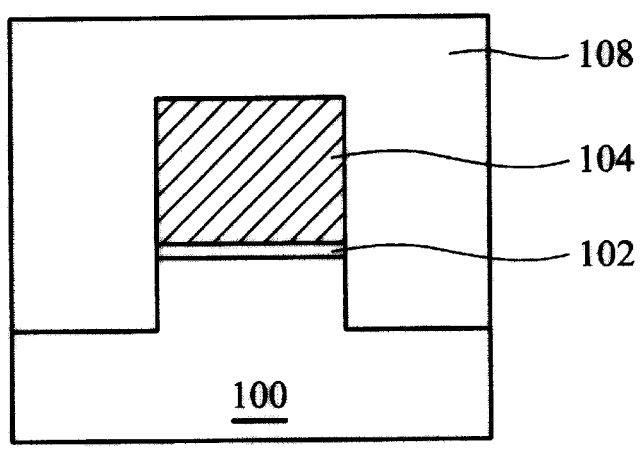
FIG. 3A is a cross-section showing a step of filling isolation oxide into the trenches in FIG. 2A according to the invention.
Figure 3B:
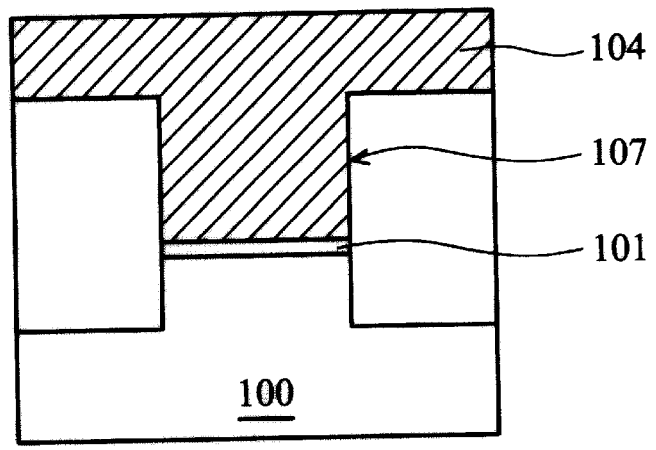
FIG. 3B is a cross-section showing a step of forming a first conductive layer over the isolation oxide in FIG. 2B according to the invention.
Figure 4:
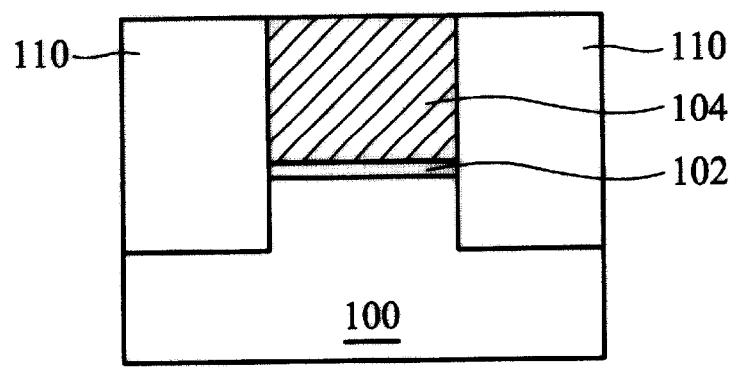
FIG. 4 is a cross-section showing a semiconductor substrate with shallow trench isolation (STI) according to FIG. 3A or FIG. 3B.

Referring now to FIG. 4, the present method begins by providing a semiconductor substrate 100 with shallow trench isolation (STI) structures 110 protruding over the substrate, and a conductive layer 104 confined between the STI structures 110. A first fabrication scheme for making the structure of FIG. 4 will now be described with reference to FIGS. 1A to 3A.

Figure 1A:
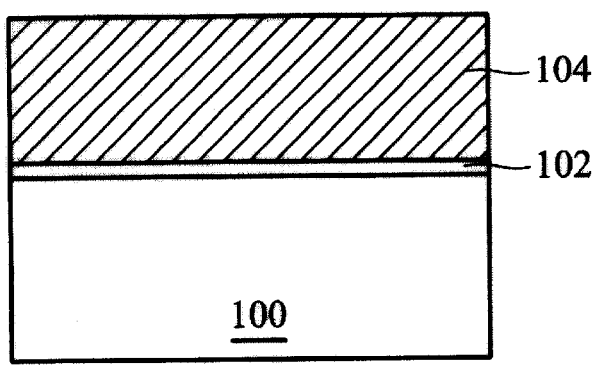
FIG. 1A is a cross-section showing a semiconductor substrate covered by a tunnel dielectric layer and a first conductive layer sequentially according to an example of the invention.

Referring to FIG. 1A, on a surface of a semiconductor substrate 100, a tunnel dielectric layer 102 and a first conductive layer 104 are sequentially formed. The tunnel dielectric layer 102 is typically a silicon oxide layer having a thickness between about 70 to 100 Å. It can be formed by a thermal oxidation process at a temperature between about 750° C. to 950° C. Alternatively, the tunnel dielectric layer can be formed by an atmospheric or low pressure chemical vapor deposition (LPCVD) process as is well known. The first conductive layer 104 over the tunnel dielectric layer 102 is typically doped polysilicon, and preferably in-situ doped polysilicon. Alternatively, the first conductive layer 104 can be doped amorphous silicon. The first conductive layer 104 is formed through methods including but not limited to Chemical Vapor Deposition (CVD) employing suitable silicon source materials, and preferably formed through an LPCVD method employing silane ($SiH_4$) as a silicon source material at a temperature range between about 530° C. to 650° C. This first conductive layer 104 preferably has a thickness between about 1000 Å and 4000 Å.

Figure 2A:
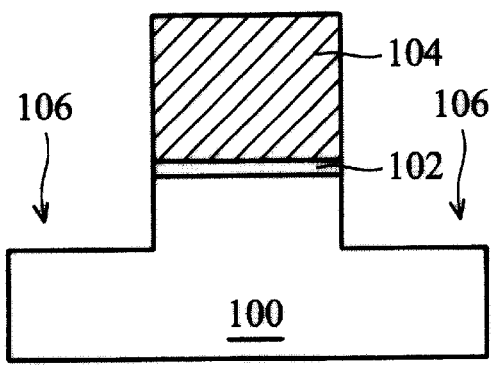
FIG. 2A is a cross-section showing a step of forming shallow trenches in the substrate in FIG. 1A according to the invention.

Referring to FIG. 2A, the first conductive layer 104, and the tunnel dielectric layer 102 are then dry etched using a photoresist pattern as an etch mask which protects all areas on which active devices will later be formed. The etching is further carried into the substrate 100 to form shallow trenches 106.

Referring to FIG. 3A, after removing the photoresist pattern, the inside walls of the trenches 106 are lined with an oxide layer (not shown) by thermal growth. Subsequently, the trenches 106 are filled with isolation oxide 108 using the method of high density plasma (HDP) deposition or LPCVD. The excess oxide outside of the trenches 106 is removed by etch back or by chemical mechanical polishing (CMP). As shown in FIG. 4, this results in shallow trench isolation (STI) structures 110 protruding over the substrate, and the first conductive layer 104 is confined between the "raised" STI structures 110.

Figure 1B:
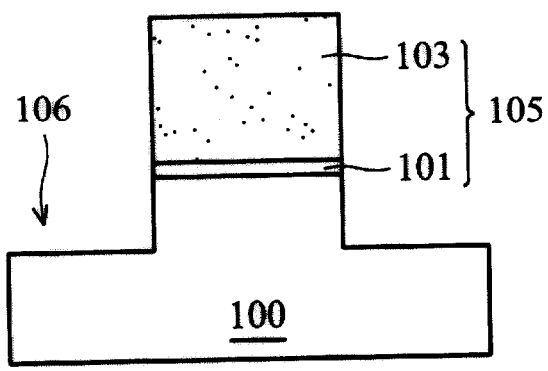
FIG. 1B is a cross-section showing a semiconductor substrate having trenches according to another example of the invention.

A second fabrication scheme for making the structure of FIG. 4 will now be described with reference to FIGS. 1B to 3B. FIG. 1B shows a semiconductor substrate 100 where trenches 106 are formed through a mask layer 105. The mask layer 105 can be a monolayer or stack dielectric layer, and preferably includes a pad oxide layer 101 and a thick nitride layer 103 as shown. The pad oxide layer 101 can be formed by thermal oxidation or by an atmospheric or low pressure chemical. vapor deposition (LPCVD) process as is well known. The silicon nitride layer 103 is usually formed by reacting dichlorosilane ($SiCl_2H_2$) with ammonia ($NH_3$) through an LPCVD process. The nitride layer 103 and the pad oxide layer 101 are then dry etched using a photoresist pattern as an etch mask which protects all areas on which active devices will later be formed. The etching is further carried into the substrate 100 to form shallow trenches 106 with a predetermined depth.

Figure 2B:
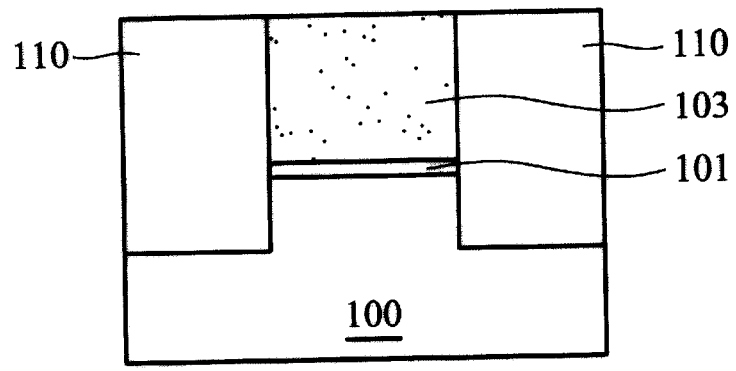
FIG. 2B is a cross-section showing a step of filling isolation oxide into the trenches in FIG. 1B according to the invention.

Referring to FIG. 2B, after removing the photoresist pattern, the inside walls of the trenches 106 are lined with an oxide layer (not shown) by thermal growth. Subsequently, the trenches 106 are filled with isolation oxide 110, and the excess oxide outside of the trenches 106 is removed by etch back or by chemical mechanical polishing (CMP).

Referring to FIG. 3B, after removing the mask layer 105, a cavity 107 is left behind in between the "raised" STI structures 110. Subsequently, a tunnel dielectric layer 102 is formed over the substrate, and a first conductive layer 104 is deposited as a blanket layer overlying the tunnel dielectric 102 and completely filling the cavity 107. The first conductive layer 104 is planarized or etched back to the surface of the STI structures 110 to give the structure of FIG. 4.

Figure 5:
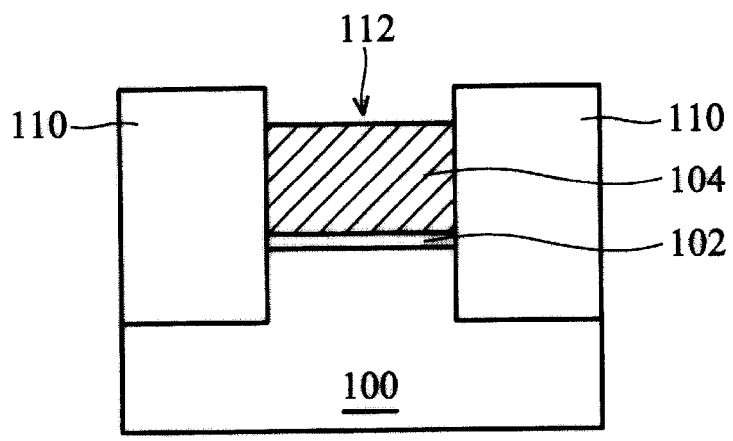
FIG. 5 is a cross-section showing a step of recessing the first conductive layer in FIG. 4 below the STI structures to leave a recess according to the invention.

Now, referring to FIG. 5, after forming the first conductive layer confined between the STI structures, the first conductive layer 104 is recessed below the STI structures 110 to leave a recess 112 by etch. The recess 112 is preferably between about 200 to 500 Å below the top surface of the STI structures 110.

Figure 6:
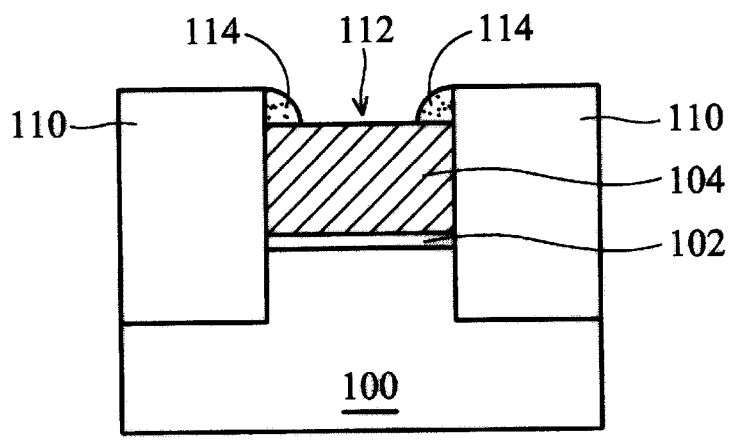
FIG. 6 is a cross-section showing a step of forming spacers on the sidewalls of the recess in FIG. 5 according to the invention.

Referring to FIG. 6, spacers 114 are formed on the sidewalls of the recess 112 by depositing a conformal layer, followed by anisotropically etching back. The spacers 114 serve as an oxidation mask for the underlying conductive layer 104. The material used to form the spacers 114 should be inert to thermal oxidation. A particularly preferred material for the spacers 114 is silicon nitride. A silicon nitride layer can be formed by reacting dichlorosilane ($SiCl_2H_2$) with ammonia ($NH_3$) through an LPCVD process. As will become apparent, the spacer width is related to the size of the floating gate, and can be used to customize a floating gate smaller than lithography limits. The spacer width should be between about 100 to 1000 Å.

Figure 7:
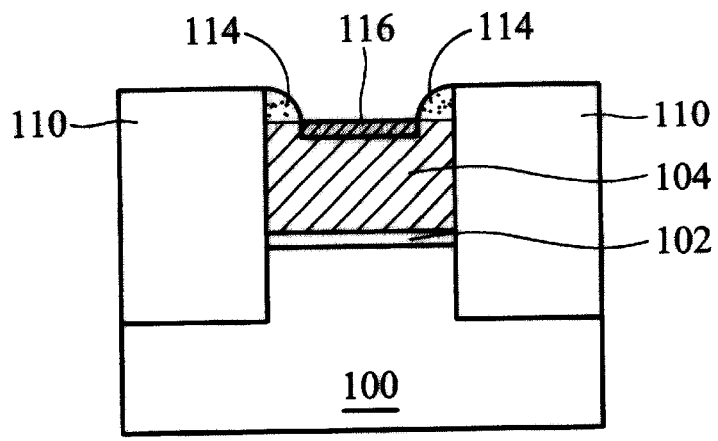
FIG. 7 is a cross-section showing a step of oxidizing the exposed surface of the conductive layer in FIG. 6 according to the invention.

Referring to FIG. 7, a thermal oxidation process is performed to oxidize the exposed surface of the conductive layer 104. An oxide layer 116 is thermally grown on the surface of the conductive layer 104 where it is not covered by the spacers 114. The thermal oxidation process is preferably performed at a temperature between about 750° C. to 950° C. The oxide layer preferably has a thickness between about 50 to 500 Å. When the conductive layer 104 is polysilicon, a poly-oxide layer will form on the exposed surface, and the surface underlying the spacers 114 will remain intact. The oxide layer 116 will serve as an etch mask in the subsequent process to define a floating gate.

Figure 8:
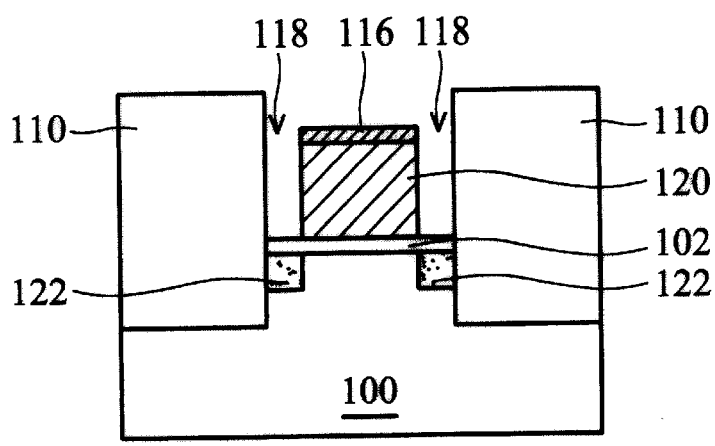
FIG. 8 is a cross-section showing steps of removing the spacers and the underlying conductive layer in FIG. 7 and forming a lightly doped region according to the invention.

Referring to FIG. 8, the spacers 114 are removed by wet etching to uncover the underlying conductive layer 104. The exposed conductive layer 104 is anisotropically etched using the oxide layer 116 as an etch mask. A reactive ion etching (RIE) process can be used for the anisotropic etch. As a result, an opening 118 is formed between the floating gate 120 and the STI structures 110, and a reduced size floating gate 120 is defined from the conductive layer 104. The resulting floating gate 120 can have a gate width beyond lithography limits. The reduced size floating gate 120 results in a smaller overlap area between the semiconductor substrate 100. This reduces the capacitance between the floating gate and the substrate, and therefore increases the capacitive coupling ratio of the nonvolatile memory device.

Subsequently, a lightly doped region 122 is optionally formed in the substrate beside the floating gate 120. The lightly doped region 122 is formed by implanting impurities through the opening 118 using the floating gate 120 as an implant mask. The lightly doped region 122 prevents the memory device from non-gate channel inversion and improves the threshold voltage (Vt) stability.

Figure 9:
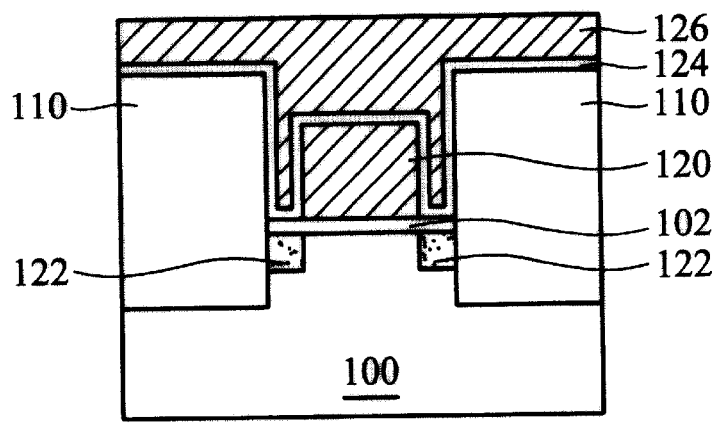
FIG. 9 is a cross-section showing a step of depositing a thin inter-gate dielectric layer and a control gate layer over the floating gate in FIG. 8 according to the invention.

Next, as shown in FIG. 9, after the oxide layer 116 is removed from the floating gate 120, a thin inter-gate dielectric layer 124 is deposited conformally lining the opening 118 and the floating gate 120. The inter-gate dielectric layer 124 is typically composed of oxide/nitride/oxide (ONO), nitride/oxide (NO), or $Ta_2O_5$. Next, a second conductive layer 126 serving as a control gate layer is formed over the inter-gate dielectric layer 120, completely filling the opening 118. The second conductive layer 126 is typically doped polysilicon, doped amorphous silicon or polycide. Finally, masking and etching are performed to define a control gate from the second conductive layer 126. Thus, a nonvolatile memory device with a reduced size floating gate and a high coupling ratio is fabricated.

While the invention has been particularly shown and described with reference to the preferred embodiment thereof, it will be understood by those skilled in the art that various changes in form and details may be made without departing from the spirit and scope of the invention.

What is claimed is:

1. A method of making a nonvolatile memory device, comprising the steps of:
   providing a substrate with shallow trench isolation (STI) structures protruding above the substrate and a conductive layer confined between the STI structures;
   recessing the conductive layer below a top surface of the STI structures to leave a recess;
   forming a spacer on sidewalls of the recess, the spacer covering a portion of the conductive layer to serve as an oxidation mask;
   growing a thermal oxide layer on the conductive layer where it is not covered by the spacer;
   removing the spacer to expose the conductive layer;
   etching an opening through the conductive layer using the thermal oxide layer as an etch mask to define a floating gate;
   removing the oxide layer;
   forming an inter-gate dielectric layer conformally lining the opening and the floating gate; and
   forming a control gate layer over the inter-gate dielectric layer and filling the opening.

2. The method as claimed in claim 1, wherein the conductive layer is formed of a material selected from the group consisting of doped amorphous silicon and doped polysilicon.

3. The method as claimed in claim 1, wherein the recess has a depth between about 200 to 500 Å.

4. The method as claimed in claim 1, wherein the spacer comprises silicon nitride.

5. The method as claimed in claim 1, wherein the spacer has a width between about 100 to 1000 Å.

6. The method as claimed in claim 1, wherein the oxide layer has a thickness between about 50 to 500 Å.

7. The method as claimed in claim 1, further comprising forming a lightly doped region in the substrate through the opening.

8. A method of making a nonvolatile memory device, comprising the steps of:
   sequentially forming a tunnel dielectric layer and a conductive layer over a substrate;
   patterning the conductive layer, the tunnel dielectric layer, and the substrate to form trenches in the substrate;
   filling the trenches with shallow trench isolation (STI) structures that protrude over the substrate;
   recessing the conductive layer below a top surface of the STI structures to leave a recess;
   forming a spacer on sidewalls of the recess, the spacer covering a portion of the conductive layer to serve as an oxidation mask;
   growing a thermal oxide layer on the conductive layer where it is not covered by the spacer;
   removing the spacer to expose the conductive layer;
   etching an opening through the conductive layer using the thermal oxide layer as an etch mask to define a floating gate;
   removing the oxide layer;
   forming an inter-gate dielectric layer conformally lining the opening and the floating gate; and
   forming a control gate layer over the inter-gate dielectric layer and filling the opening.

9. The method as claimed in claim 8, wherein the conductive layer is formed of a material selected from the group consisting of doped amorphous silicon and doped polysilicon.

10. The method as claimed in claim 8, wherein the recess has a depth between about 200 to 500 Å.

11. The method as claimed in claim 8, wherein the spacer comprises silicon nitride.

12. The method as claimed in claim 8, wherein the spacer has a width between about 100 to 1000 Å.

13. The method as claimed in claim 8, wherein the oxide layer has a thickness between about 50 to 500 Å.

14. The method as claimed in claim 8, further comprising forming a lightly doped region in the substrate through the opening.

15. A method of making a nonvolatile memory device, comprising the steps of:
   forming a mask layer on a semiconductor substrate;
   patterning the mask layer and the substrate to form trenches in the substrate;
   filling the trenches with shallow trench isolation (STI) structures that protrude over the substrate;
   removing the mask layer to leave a cavity between the STI structures;
   forming a tunnel dielectric layer on the substrate;
   forming a conductive layer on the tunnel dielectric layer and filling the cavity;
   recessing the conductive layer below a top surface of the STI structures to leave a recess;
   forming a spacer on sidewalls of the recess, the spacer covering a portion of the conductive layer to serve as an oxidation mask;
   growing a thermal oxide layer on the conductive layer where it is not covered by the spacer;
   removing the spacer to expose the conductive layer;
   etching an opening through the conductive layer using the thermal oxide layer as an etch mask to define a floating gate;
   removing the oxide layer;

forming an inter-gate dielectric layer conformally lining the opening and the floating gate; and forming a control gate layer over the inter-gate dielectric layer and filling the opening.

16. The method as claimed in claim 15, wherein the conductive layer is formed of a material selected from the group consisting of doped amorphous silicon and doped polysilicon.

17. The method as claimed in claim 15, wherein the recess has a depth between about 200 to 500 Å.

18. The method as claimed in claim 15, wherein the spacer comprises silicon nitride.

19. The method as claimed in claim 15, wherein the spacer has a width between about 100 to 1000 Å.

20. The method as claimed in claim 15, further comprising forming a lightly doped region in the substrate through the opening.

* * * * *